(12) United States Patent
Dahal et al.

(10) Patent No.: US 11,677,041 B2
(45) Date of Patent: Jun. 13, 2023

(54) RADIATION-DETECTING STRUCTURES AND FABRICATION METHODS THEREOF

(71) Applicant: RENSSELAER POLYTECHNIC INSTITUTE, Troy, NY (US)

(72) Inventors: Rajendra P. Dahal, Troy, NY (US); Ishwara B. Bhat, Clifton Park, NY (US); Yaron Danon, Selkirk, NY (US); James Jian-Qiang Lu, Watervliet, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 15/319,979

(22) PCT Filed: Jun. 22, 2015

(86) PCT No.: PCT/US2015/036926
§ 371 (c)(1),
(2) Date: Dec. 19, 2016

(87) PCT Pub. No.: WO2016/053414
PCT Pub. Date: Apr. 7, 2016

(65) Prior Publication Data
US 2017/0133543 A1    May 11, 2017

Related U.S. Application Data

(60) Provisional application No. 62/015,605, filed on Jun. 23, 2014.

(51) Int. Cl.
*H01L 31/115* (2006.01)
*H01L 31/0304* (2006.01)
(Continued)

(52) U.S. Cl.
CPC ........ *H01L 31/115* (2013.01); *H01L 21/0243* (2013.01); *H01L 21/0254* (2013.01);
(Continued)

(58) Field of Classification Search
CPC ..... H01L 31/115; H01L 31/08; H01L 31/085; H01L 31/09; H01L 31/10; H01L 31/101;
(Continued)

(56) References Cited

U.S. PATENT DOCUMENTS 5,330,611 A * 7/1994 Doll ........................ C23C 16/36
257/E21.124
5,866,931 A    2/1999 Bulucea et al.
(Continued)

OTHER PUBLICATIONS

McGregor et al, "Self-Biased Boron-10 Coated High-Purity Epitaxial GaAs Thermal Neutron Detectors", IEEE Transactions on Nuclear Science, vol. 47, No. 4, Aug. 2000 (pp. 1364-1370).
(Continued)

*Primary Examiner* — Kenneth Parker
*Assistant Examiner* — John Lin
(74) *Attorney, Agent, or Firm* — Murtha Cullina LLP; Anthony P. Gangemi (57) ABSTRACT

Radiation detecting-structures and fabrications methods thereof are presented. The methods include, for instance: providing a substrate, the substrate including at least one trench extending into the substrate from an upper surface thereof; and epitaxially forming a radiation-responsive semiconductor material layer from one or more sidewalls of the at least one trench of the substrate, the radiation-responsive semiconductor material layer responding to incident radiation by generating charge carriers therein. In one embodiment, the sidewalls of the at least one trench of the substrate include a (111) surface of the substrate, which facilitates epitaxially forming the radiation-responsive semiconductor material layer. In another embodiment, the radia-
(Continued)

tion-responsive semiconductor material layer includes hexagonal boron nitride, and the epitaxially forming includes providing the hexagonal boron nitride with an a-axis aligned parallel to the sidewalls of the trench.

8 Claims, 4 Drawing Sheets

(51) Int. Cl.
    *H01L 21/02*     (2006.01)
    *H01L 31/18*     (2006.01)
    *H01L 31/0384*     (2006.01)

(52) U.S. Cl.
    CPC .... *H01L 21/0262* (2013.01); *H01L 21/02433* (2013.01); *H01L 21/02458* (2013.01); *H01L 21/02562* (2013.01); *H01L 31/03044* (2013.01); *H01L 31/0384* (2013.01); *H01L 31/184* (2013.01); *H01L 31/1856* (2013.01); Y02E 10/544 (2013.01)

(58) Field of Classification Search
    CPC ............. H01L 31/0248; H01L 31/0256; H01L 31/0264; H01L 31/0304; H01L 31/03044; H01L 31/18; H01L 31/184; H01L 31/1856; H01L 31/036; H01L 31/0384; H01L 31/0352
    See application file for complete search history.

(56) References Cited

U.S. PATENT DOCUMENTS

| | | | |
|---|---|---|---|
| 6,545,281 B1 | | 4/2003 | McGregor et al. |
| 7,095,006 B2 | | 8/2006 | Yang |
| 7,164,138 B2 | | 1/2007 | McGregor et al. |
| 7,183,701 B2 | | 2/2007 | Downing et al. |
| 7,297,564 B1 | * | 11/2007 | Tweet ................. H01L 31/1812 438/22 |
| 7,372,009 B1 | * | 5/2008 | Losee ....................... G01T 3/08 250/200 |
| 7,592,601 B2 | | 9/2009 | Frank |
| 7,855,372 B2 | | 12/2010 | McGregor et al. |
| 8,022,369 B2 | | 9/2011 | Orava et al. |
| 8,367,528 B2 | | 2/2013 | Bauer et al. |
| 8,778,715 B2 | | 7/2014 | Bellinger et al. |
| 2005/0127275 A1 | * | 6/2005 | Yang .................. H01L 31/1055 250/214 R |
| 2007/0012876 A1 | * | 1/2007 | Lee .................... H01L 21/02381 250/338.4 |
| 2009/0302231 A1 | | 12/2009 | McGregor et al. |
| 2010/0304204 A1 | | 12/2010 | Routkevitch et al. |
| 2011/0117732 A1 | * | 5/2011 | Bauer .............. H01L 21/02381 438/507 |
| 2011/0233420 A1 | * | 9/2011 | Feller .................... H01L 31/085 257/E31.086 |
| 2012/0235260 A1 | | 9/2012 | Nikolic et al. |
| 2012/0313196 A1 | | 12/2012 | Li |
| 2013/0009262 A1 | * | 1/2013 | Dowben ............... H01L 31/109 257/E31.028 |
| 2013/0292685 A1 | * | 11/2013 | Jiang ................... H01L 31/0304 257/76 |
| 2013/0334541 A1 | | 12/2013 | Voss et al. |
| 2014/0027775 A1 | * | 1/2014 | Quick ............... C23C 16/45525 257/53 |
| 2014/0077089 A1 | | 3/2014 | Orava et al. |
| 2014/0252520 A1 | * | 9/2014 | Dahal ............... H01L 31/03529 257/429 |

OTHER PUBLICATIONS

Majety et al., "Metal-Semiconductor-Metal Neutron Detectors Based on Hexagonal Boron Nitride Epitaxial Layers", Procedures of SPIE, vol. 8507 (Oct. 2012) (9 pages).

Dahal et al., International Search Report & Written Opinion for PCT/US2015036926 (WO 2016/053414 A2), dated Mar. 29, 2016 (13 pages).

* cited by examiner

RADIATION-DETECTING STRUCTURES AND FABRICATION METHODS THEREOF

CROSS-REFERENCE TO RELATED APPLICATION

This application is a § 371 U.S. National Phase application which claims priority from International Application Serial No. PCT/US2015/036926, filed Jun. 22, 2015, which published Apr. 7, 2016 as PCT Publication No. WO 2016/053414 A2, and which claims the benefit of U.S. Provisional Patent Application No. 62/015,605, filed Jun. 23, 2014, each of which is hereby incorporated herein by reference in its entirety.

STATEMENT REGARDING FEDERALLY SPONSORED RESEARCH OR DEVELOPMENT

This invention was made with United States Government support under contract number 2013-DN-077-ER0001 awarded by the United States Department of Homeland Security—Domestic Nuclear Detection Office. The United States Government has certain rights in the invention.

BACKGROUND

Solid-state radiation detectors, which make use of radiation-responsive material in conjunction with semiconductor collector material, have been proposed. For example, in order to detect radiation, such as neutron or gamma radiation, a solid-state radiation detector may include radiation-responsive converter materials that react with the radiation to produce reaction products, along with semiconductor collector materials that collect charge carriers generated by the reaction products to indicate a radiation detection event.

Unfortunately, existing radiation detectors can be inefficient for a number of reasons. For example, the proportion of converter material to collector material in a conventional solid-state radiation detector is inherently limited, leading to a limit on radiation detection efficiency. In addition, typically used semiconductor collector materials, such as silicon substrates, are not radiation-hardened, potentially leading to a reduced lifespan of the radiation detector, and/or limitations on the use of the detector to low radiation flux environments. A need thus remains for enhanced solid-state radiation detectors with increased detection efficiency and suitability for use in high radiation flux environments.

BRIEF SUMMARY

The shortcomings of the prior art are overcome, and additional advantages are provided, through the provision, in one aspect, of a method for fabricating a radiation-detecting structure. The method includes: providing a substrate, the substrate comprising at least one trench extending into the substrate from an upper surface thereof; and epitaxially forming a radiation-responsive semiconductor material over one or more sidewalls of the at least one trench of the substrate, the radiation-responsive semiconductor material being responsive to incident radiation by generating charge carriers therein. For example, the method allows for fabrication of radiation-detecting structures with a greater volume of radiation-responsive material, because the radiation-responsive semiconductor material can be configured to respond to radiation and facilitate collection of charge carriers.

In one embodiment, the epitaxially forming includes forming the radiation-responsive semiconductor material layer with a sidewall-aligned crystal axis aligned parallel to the one or more sidewalls of the at least one trench of the substrate, where a mobility of the charge carriers along the sidewall-aligned crystal axis of the radiation-responsive semiconductor material layer is greater than another mobility of the charge carriers along another crystal axis thereof, where the greater mobility of the charge carriers along the sidewall-aligned crystal axis of the radiation-responsive semiconductor material layer facilitates detection of incident radiation. For example, in such an embodiment, sensitivity of a radiation detector is enhanced by collecting charge carriers along the greater mobility crystal axis.

In another embodiment, the one or more sidewalls of the at least one trench of the substrate include a (111) surface of the substrate, with the (111) surface of the substrate facilitating crystalline alignment of the radiation-responsive semiconductor material layer within the at least one trench. For example, in such an embodiment, the epitaxially growing may be directed by the (111) surface to allow for enhanced filling of the trench with the radiation-responsive semiconductor material.

In a further embodiment, the radiation-responsive semiconductor material layer includes a layer of hexagonal boron nitride, and the epitaxially forming includes forming the hexagonal boron nitride with an a-axis aligned parallel to the one or more sidewalls of the trench of the substrate. The aligned a-axis may allow, for instance, for greater collection of charge carriers generated by, e.g., neutrons, to facilitate neutron detection.

In one embodiment, the radiation-responsive semiconductor material layer includes n-type dopants or p-type dopants, the n-type or p-type dopants increasing an amount of the charge carriers to facilitate detection of the incident radiation. For example, the doped radiation-responsive semiconductor material may have a greater amount of charge carriers than an intrinsic radiation-responsive semiconductor material.

In another embodiment, the one or more sidewalls of the at least one trench include a first sidewall and a second sidewall, and the epitaxially forming includes forming the radiation-responsive semiconductor material layer from both the first and second sidewalls of the at least one trench. For example, such an embodiment may allow for faster formation of radiation-detecting structures due to growth from multiple sidewalls.

In a further embodiment, the first sidewall is disposed in opposing relation to the second sidewall, and the epitaxially forming further includes filling the at least one trench with the radiation-responsive semiconductor material layer, with the first and second sidewalls of the at least one trench confining the radiation-responsive semiconductor material layer therein. For example, such an embodiment may inhibit buckling or separation of the radiation-responsive semiconductor material from the sidewalls.

In one embodiment, the epitaxially forming includes providing pulses of a precursor gas within the at least one trench, the precursor gas including the radiation-responsive semiconductor material, and the pulses of the precursor gas facilitate growth and crystallization of the radiation-responsive semiconductor material layer along the one or more sidewalls of the at least one trench.

In another embodiment, the method further includes providing contact structures above and below the substrate and in electrical contact with the radiation-responsive semiconductor material layer, the contact structures facilitating detecting the incident radiation by collecting the charge carriers generated within the radiation-responsive semiconductor material layer due to the incident radiation. For example, aligning contact structures above and below the trench may allow for collection of charge carriers from radiation detection events occurring throughout the radiation-responsive semiconductor material within the trench.

In another embodiment, the providing includes providing the substrate with the upper surface thereof including a (110) surface; and anisotropically etching the substrate from the (110) surface thereof to form the at least one trench with the one or more sidewalls with at least one (111) surface, where the at least one (111) of the substrate facilitates crystalline alignment of the radiation-responsive semiconductor material layer within the at least one trench. For example, such an embodiment may allow for predictable formation of trenches having the sidewalls with a desired orientation to facilitate alignment of later-formed radiation-responsive semiconductor material.

In a further embodiment, the epitaxially forming includes providing a conformal buffer layer over the one or more sidewalls of the at least one trench, the conformal buffer layer inhibiting chemical reaction of the substrate and the radiation-responsive semiconductor material layer within the substrate during the epitaxially forming. For example, the conformal buffer layer may be used if a precursor material used to form the radiation-responsive semiconductor material has a potential to react with the material of the substrate.

In one embodiment, the radiation-detecting structure includes a neutron-detecting structure and the radiation-responsive semiconductor material layer includes a neutron-responsive semiconductor material layer. For example, the method may be used to fabricate neutron-detecting structures for use in neutron detectors.

In another aspect, a radiation-detecting structure is presented. The structure includes: a substrate, the substrate including at least one trench extending into the substrate from an upper surface thereof; and an epitaxial layer disposed over one or more sidewalls of the at least one trench of the substrate, the epitaxial layer including a radiation-responsive semiconductor material that is responsive to incident radiation by generating charge carriers therein.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

The present disclosure provides, in part, radiation-detecting structures and methods for fabricating radiation-detecting structures for detection of, for example, neutrons, gamma radiation, ultraviolet radiation, etc. Such radiation detectors could be used, for instance, to monitor illicit nuclear activities at ports, highways, business centers, etc., or wherever deployment may be desirable to help promote national security and/or safety.

By way of background, conventional solid-state radiation detectors make use of a radiation-responsive material disposed adjacent to a semiconductor material with a p-n junction, with the two materials serving two different purposes. First, in such detectors, incident radiation reacts with the radiation-responsive material to produce charged reaction products. Next, the charged reaction products move into the semiconductor material, generating charge carriers which are collected using the p-n junction. By contrast, the techniques disclosed herein make use of a single radiation-responsive semiconductor material to serve both purposes.

Typical solid-state radiation detectors include two primary components, a radiation-responsive material that reacts with the radiation to produce radiation products, and a semiconductor collector material that collects charge carriers generated by the reaction products. In order to produce a solid-state radiation detector with sufficient collector material and required structural integrity, typically at most approximately 50% of the volume of the detector can include the radiation-responsive material, with the balance of the volume comprising the semiconductor collector materials and/or other structural materials. Additionally, typical semiconductor collection material, such as silicon, is not radiation hardened, and can degrade over time, reducing the efficiency of radiation detection, or can limit the use of such radiation detectors to low radiation environments only.

Advantageously, the structures and fabrication methods disclosed herein provide more robust radiation detectors with efficiencies of 80% to nearly 100%, by using a single medium for both generation of reaction products, such as secondary charged particles, and also for collection of charge carriers caused by the reaction products. Applicants have discovered that a particular crystalline alignment of radiation-responsive semiconductor materials can greatly improve collection of charge carriers due to incident radiation. Specifically, aligning the radiation-responsive material along a (111) crystal plane, with collection electrodes positioned on either end, has proven to optimize charge collection sensitivity and enhance radiation detector efficiency. Thus, structures and fabrication methods disclosed herein provide radiation detectors with enhanced efficiency of charge carrier collection by aligning the crystal axis of radiation-responsive materials within radiation-detecting structures so that charge carrier collection proceeds along the highest mobility axis to the contact structures, reducing the amount of false negatives.

As described herein, a radiation-detecting structure may include a radiation-responsive semiconductor material layer having a regular crystal structure, with the crystal structure aligned so that conductive contacts may efficiently collect charge carriers due to incident radiation along a specific crystal axis of the radiation-responsive semiconductor material layer. Such alignment can optimize the collection of charge carriers generated by incident radiation, thus improving the radiation detection sensitivity, because specific crystal axes of a semiconductor material may have different charge-carrier mobilities that are greater than the mobility along a random direction. In one embodiment, such a radiation-responsive semiconductor material with a regular crystal structure may be a nearly single-crystal radiation-responsive semiconductor material layer, the nearly single-crystal layer having a defect rate of, for example, less than 500 parts per million. In another embodiment, a radiation-detecting structure may include a radiation-responsive semiconductor material formed as an epitaxial layer, which has a regular crystal structure. By contrast with conventional techniques, the approaches described herein allow charge carriers due to incident radiation to be directly collected from the radiation-responsive material using directly connected conductive contacts, rather than requiring a separate semiconductor material with a p-n junction to collect the charge carriers.

As another advantage, structures and fabrication methods disclosed herein may make use of boron nitride, and more specifically a specific crystalline form known as hexagonal boron nitride (h-BN), which is a wide band-gap semiconductor, having an energy band-gap of approximately 6 electron volts (eV). For example, h-BN may detect a neutron by the (n, alpha) reaction, and electron-hole pairs generated by the (n, alpha reaction) can be collected to indicate a radiation detection event. In addition, radiation detecting-structures using boron nitride can be operated in harsh environments, such as high temperature, high neutron, or high gamma background radiation environments, without significant device performance degradation or damage by alpha particles.

Further, the structures and fabrication methods disclosed herein overcome several challenges when using boron nitride. For example, depositing a sufficient thickness of h-BN (e.g., approximately 50 μm) on a substrate can be challenging. This is because as the thickness of h-BN increases beyond a critical thickness, h-BN structures tend to buckle and lift from the substrate. In addition, growing h-BN can lead to poorly performing radiation-detectors because of poor charge carrier connectivity along the h-BN. Further, h-BN based neutron detectors may overcome problems caused by charge carrier trapping in certain neutron detectors, which could lead to an efficiency reduction of neutron detectors during their deployed lifetime.

Generally stated, provided herein, in one aspect, is a radiation-detecting structure. The structure includes: a substrate, the substrate including at least one trench extending into the substrate from an upper surface thereof; and an epitaxial layer disposed over one or more sidewalls of the at least one trench of the substrate, the epitaxial layer including a radiation-responsive semiconductor material that is responsive to incident radiation by generating charge carriers therein. Note that as used herein, the epitaxial layer of radiation-responsive semiconductor material is alternatively referred to as a radiation-responsive semiconductor material layer.

In one embodiment, the epitaxial layer comprises a sidewall-aligned crystal axis aligned parallel to the one or more sidewalls of the at least one trench of the substrate, and a mobility of the charge carriers along the sidewall-aligned crystal axis of the radiation-responsive semiconductor material is greater than another mobility of the charge carriers along another crystal axis thereof, the greater mobility of the charge carriers along the sidewall-aligned crystal axis of the epitaxial layer facilitating detection of the incident radiation.

In another embodiment, the one or more sidewalls of the at least one trench of the substrate comprise a (111) surface of the substrate, the radiation-responsive semiconductor material layer being in crystalline alignment with the (111) surface of the at least one trench.

In a further embodiment, the radiation-responsive semiconductor material of the epitaxial layer comprises hexagonal boron nitride, the hexagonal boron nitride comprising an a-axis, and the a-axis of the hexagonal boron nitride being aligned parallel to the one or more sidewalls of the trench of the substrate.

In one implementation, the one or more sidewalls of the at least one trench comprise a first sidewall and a second side wall, and the epitaxial layer of the radiation-responsive semiconductor material layer is disposed over the first and second sidewalls of the at least one trench.

In another implementation, the structure further includes contact structures, the contact structures being disposed above and below the substrate and in electrical contact with the radiation-responsive semiconductor material layer of the epitaxial layer, the contact structures facilitating detecting the incident radiation by collecting the charge carriers generated within the radiation-responsive semiconductor material layer due to the incident radiation.

In another implementation, the structure further includes a conformal buffer layer disposed between the one or more sidewalls of the at least one trench and the epitaxial layer of the radiation-responsive semiconductor material layer, the conformal buffer layer inhibiting chemical reaction of the radiation-responsive semiconductor material layer with the substrate.

In a further embodiment, the radiation-detecting structure comprises a neutron-detecting structure, and the radiation-responsive semiconductor material layer comprises a neutron-responsive semiconductor material.

Reference is made below to the drawings, which are not drawn to scale for ease of understanding, wherein the same reference numbers used throughout different figures designate the same or similar components.

Figure 1:
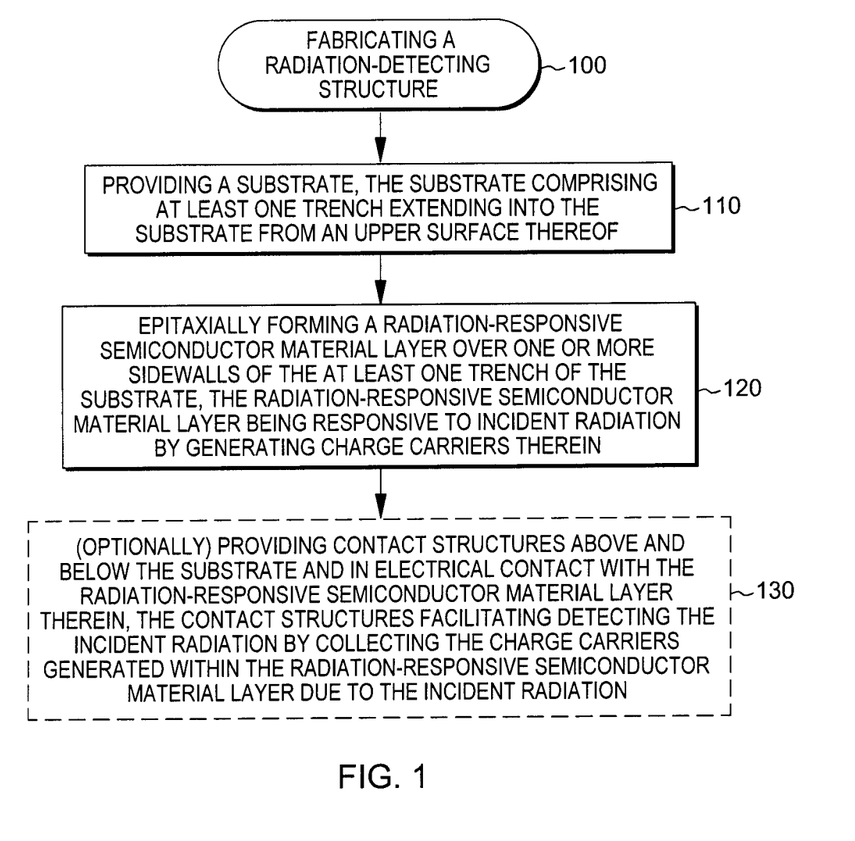
FIG. 1 depicts embodiments of a process for fabricating a radiation-detecting structure, in accordance with one or more aspects of the present invention.

FIG. 1 depicts one embodiment of a process for fabricating a radiation-detecting structure 100, in accordance with one or more aspects of the present invention. The fabricating 100 includes, for example: providing a substrate, the substrate including at least one trench extending into the substrate from an upper surface thereof 110; and epitaxially forming a radiation-responsive semiconductor material layer over one or more sidewalls of the at least one trench of the substrate, the radiation-responsive semiconductor material layer being responsive to incident radiation by generating charge carriers therein 120.

In one embodiment, the fabricating 100 (optionally) includes providing contact structures above and below the substrate and in electrical contact with the radiation-responsive semiconductor material layer, the contact structures facilitating detecting the incident radiation by collecting the charge carriers generated within the radiation-responsive semiconductor material layer due to the incident radiation 130.

In another embodiment, the epitaxially forming 120 includes forming the radiation-responsive semiconductor material layer with a sidewall-aligned crystal axis aligned parallel to the one or more sidewalls of the at least one trench of the substrate, where a mobility of the charge carriers along the sidewall-aligned crystal axis of the radiation-responsive semiconductor material layer is greater than another mobility of the charge carriers along another crystal axis thereof, the greater mobility of the charge carriers along the sidewall-aligned crystal axis of the radiation-responsive semiconductor material layer facilitating collection of the charge carriers, and thus, detection of the incident radiation.

In a further embodiment, the one or more sidewalls of the at least one trench of the substrate include a (111) surface of the substrate, the (111) surface of the substrate facilitating crystalline alignment of the radiation-responsive semiconductor material layer with the at least one trench.

In one example, the radiation-responsive semiconductor material layer includes a layer of hexagonal boron nitride, and the epitaxially forming 120 includes forming the hexagonal boron nitride with an a-axis aligned parallel to the one or more sidewalls of the trench of the substrate. In another example, the radiation-responsive semiconductor material layer includes n-type dopants or p-type dopants, the n-type or p-type dopants increasing an amount of the charge carriers to facilitate detection of the incident radiation.

In one implementation, the one or more sidewalls of the at least one trench include a first sidewall and a second sidewall, and the epitaxially forming 120 includes forming the radiation-responsive semiconductor material layer from both the first and second sidewalls of the at least one trench. In such a case, the first sidewall may be disposed in opposing relation to the second sidewall, and the epitaxially forming 120 further may include filling the at least one trench with the radiation-responsive semiconductor material layer, with the first and second sidewalls of the at least one trench confining the radiation-responsive semiconductor material layer therein.

In one embodiment, the epitaxially forming 120 includes providing pulses of a precursor gas within the at least one trench, the precursor gas including the radiation-responsive semiconductor material, and the pulses of the precursor gas facilitate growth and crystallization of the radiation-responsive semiconductor material layer along the one or more sidewalls of the at least one trench.

In another embodiment, the providing 110 includes providing the substrate with the upper surface thereof including a (110) surface; and anisotropically etching the substrate from the (110) surface to form the at least one trench with the one or more sidewalls having a (111) surface, where the (111) surface facilitates crystalline alignment of the radiation-responsive semiconductor material layer within the sidewall(s) of the substrate.

In another embodiment, the epitaxially forming 120 includes providing a conformal buffer layer over the one or more sidewalls of the at least one trench, the conformal buffer layer inhibiting chemical reaction of the substrate and the radiation-responsive semiconductor material layer within the substrate during the epitaxially forming. In a further embodiment, the radiation-detecting structure includes a neutron-detecting structure and the radiation-responsive semiconductor material layer includes a neutron-responsive semiconductor material layer.

Figure 2A:
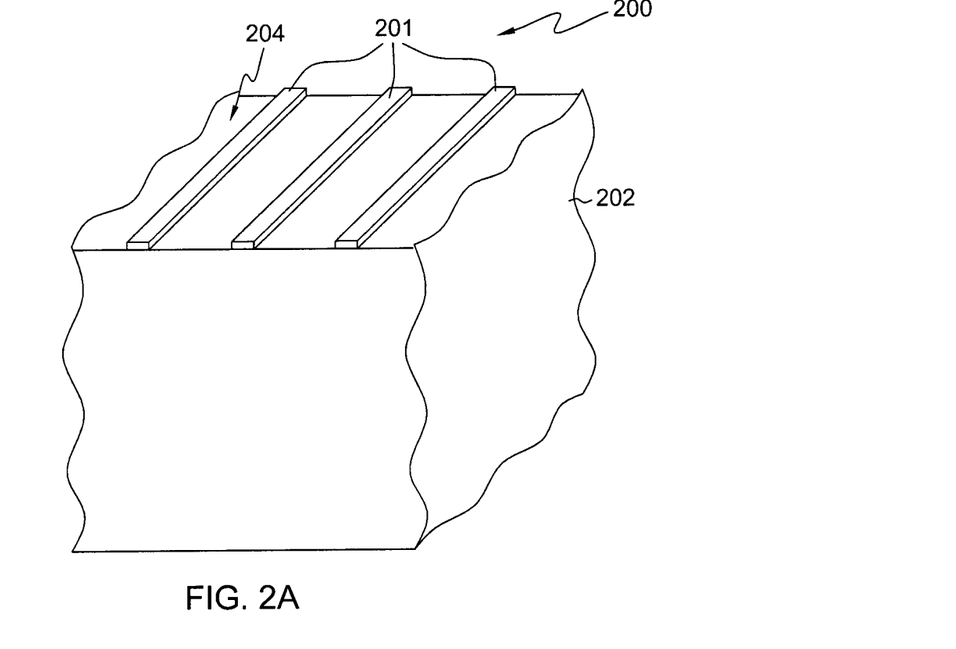
FIG. 2A is an isometric view of an intermediate structure during a radiation-detecting-structure fabrication process, in accordance with one or more aspects of the present invention.

By way of further explanation, FIGS. 2A-2F depict one detailed embodiment of a process of fabricating a radiation-detecting structure, in accordance with one or more aspects of the present invention. In particular, FIG. 2A is an isometric view of an intermediate structure 200 during a radiation-detecting-structure fabrication process, in accordance with one or more aspects of the present invention.

In the embodiment of FIG. 2A, structure 200 includes a substrate (or wafer) 202. By way of example, substrate 202 may be a crystalline semiconductor material, such as silicon (Si), germanium (Ge), gallium arsenide (GaAs), gallium nitride (GaN), aluminum nitride (AlN), silicon carbide (SiC), or any combination thereof. In addition, substrate 202 may have a specified crystallographic orientation, such that an upper surface of substrate 202 is chosen to enable alignment of a crystal axis of an after-formed radiation-responsive semiconductor material layer, as described below. In one specific example, substrate 202 may include silicon, and an upper surface of substrate 202 may include a (110) surface, as denoted using the Miller index crystallography notation system. In addition, substrate 202 may include multiple regions with different doping types, such as n-type or p-type dopants of varying concentrations.

In the illustrated embodiment, substrate 202 has been patterned with a mask 201 over an upper surface 204 thereof, which may be, for example, a hard-mask. For example, photolithographic masking techniques may be used to form mask 201.

Figure 2B:
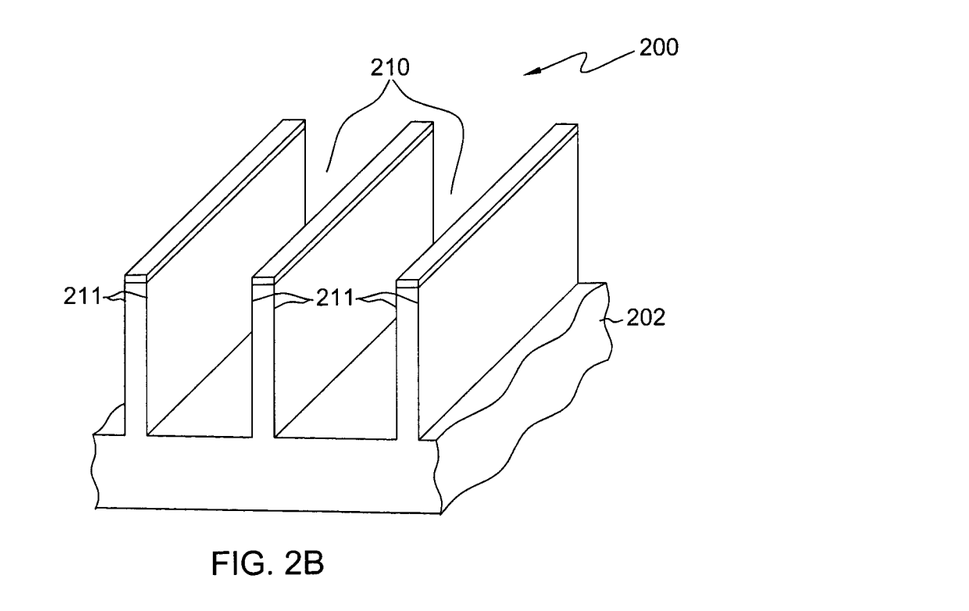
FIG. 2B depicts the structure of FIG. 2A, after selectively etching the substrate from an upper surface to form at least one trench therein, in accordance with one or more aspects of the present invention.

FIG. 2B depicts structure 200, after etching substrate 202 from the upper surface to form at least one trench 210, each with one or more sidewalls 211.

In one embodiment, substrate 202 may be a single crystal substrate, and upper surface 204 (FIG. 2A) may be or include a (110) surface. In such a case, substrate 202 may be etched from upper surface 204 to form sidewalls 211 with (111) surfaces. For example, substrate 202 may be anisotropically etched in such a way that sidewalls 211 include surfaces that follow the crystal planes of the substrate, and reveal (111) surface sidewalls.

By way of explanation, anisotropic etching refers to etching that is orientation dependent, and when etching a crystalline substrate, certain etching processes have different etch rates along different direction crystal directions. In such a case, etching a single crystal substrate can lead to exposure of surfaces that follow a natural crystal direction of the substrate, for example denoted as (100), (110) or (111)

directions. This is because the different etch rates along different crystal directions, e.g., (110) and (111) directions, can naturally limit the etching in one direction as opposed to another, leading to exposure of surfaces with specific crystal orientations, e.g., (111) surfaces.

In one or more embodiments, anisotropic etching can include reactive ion etching (RIE), plasma etching, or wet etching. For example, wet etching can make use of chemicals such as potassium hydroxide or tetramethylammonium hydroxide (TMAH), or a combination thereof.

In one embodiment, trenches 210 may have a depth of 50 μm or more, depending upon the desired depth to optimize radiation detection of incident radiation for a particular application.

Figure 2C:
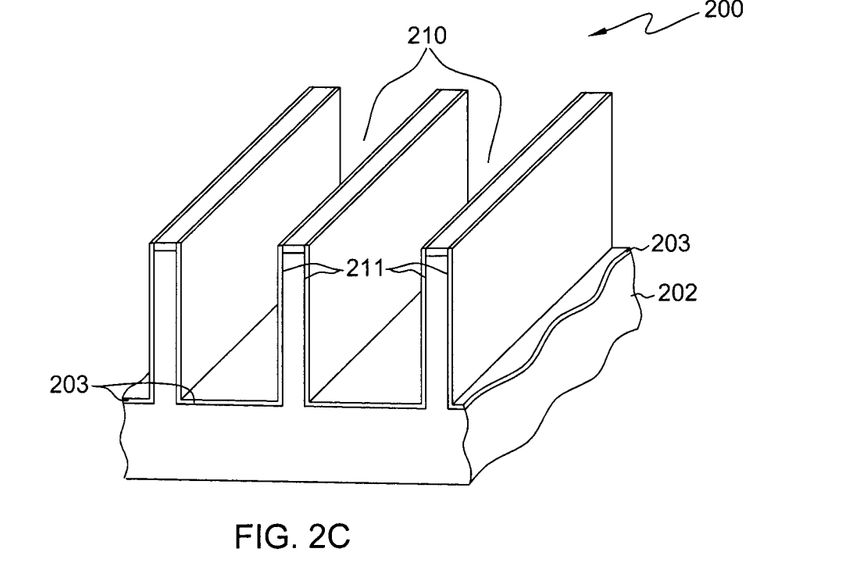
FIG. 2C depicts the structure of FIG. 2B, after providing a conformal buffer layer within the trenches in the substrate, in accordance with one or more aspects of the present invention.

FIG. 2C depicts structure 200, after providing a conformal buffer layer 203, including over sidewalls 211 of trenches 210. By way of example, depositing certain materials, such as boron nitride, into trenches 210 can be difficult because a precursor gas of the boron nitride, such as ammonia, may react with the material of substrate 202, such as silicon; that is, a silicon substrate could react with nitrogen to undesirably form silicon nitride.

In one or more embodiments, conformal buffer layer 203 may be provided to prevent a chemical reaction between substrate 202 and the detecting material to be deposited into trenches 210. For example, conformal buffer layer 203 may be one or more monolayers of atoms or molecules disposed over sidewalls 211. In one specific example, conformal buffer layer 203 may include one or more monolayers of aluminum nitride (AlN) disposed over substrate containing silicon. In such an example, the AlN conformal buffer layer can prevent reaction of the silicon with, for example, a nitrogen containing gas, such as ammonia, during formation of hexagonal boron nitride. In another example, conformal buffer layer 203 may include one or more monolayers of boron to prevent reaction of the silicon during formation of a radiation-responsive semiconductor material layer containing boron nitride. In a further example, conformal buffer layer 203 may include one or more monolayers of germanium to prevent reaction of the silicon during formation of a radiation-responsive semiconductor material layer containing cadmium telluride.

Figure 2D:
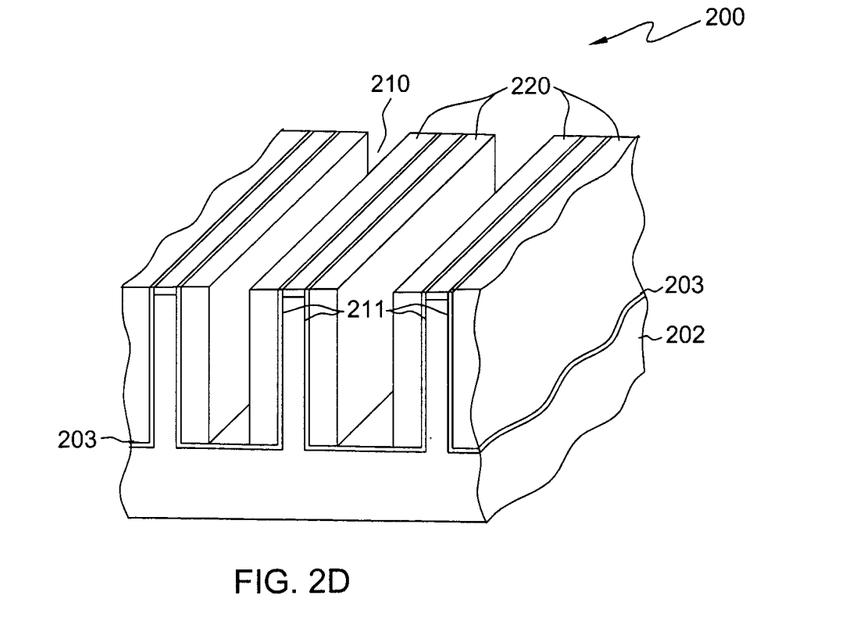
FIG. 2D depicts the structure of FIG. 2C, after partially forming an epitaxial layer of a radiation-responsive semiconductor material from the one or more sidewalls of the trenches, in accordance with one or more aspects of the present invention.

FIG. 2D depicts structure 200, after (partially) epitaxially forming an epitaxial layer 220 of a radiation-responsive semiconductor material within the trenches 210 from sidewalls 211. By way of explanation, epitaxial formation refers to the orderly formation of one crystalline material over another crystalline material, such as a sidewall of the substrate, where at the interface of the materials, the formed material is arranged with the same crystal orientation as the underlying substrate surface.

In the embodiment of FIG. 2D, epitaxial formation proceeds along each of the sidewalls 211 of trenches 210, advantageously allowing for faster formation of epitaxial layer 220 of the radiation-responsive semiconductor material than if growth proceeded only along a single sidewall. For example, for a 10 μm trench, growth of approximately 5 μm on each side of the trench will fill the trench.

In one or more embodiments, the radiation-responsive semiconductor material of epitaxial layer 220 may be selected to be responsive (e.g., by reacting with) to the presence of incident radiation by generating charge carriers. For example, the incident radiation may react with the radiation-responsive semiconductor material of epitaxial layer 220 to generate reaction products, such as charged ions, and the reaction products may in turn generate charge carriers within radiation responsive semiconductor material 220.

In certain embodiments, radiation-responsive semiconductor material may be formed in such a way that a specific crystal axis is aligned parallel to sidewalls 211 of trenches 210. By way of explanation, in a crystalline material, such as a crystalline semiconductor, the mobility of charge carriers may be different along different crystal axes. Therefore, in one or more embodiments, a sidewall-aligned crystal axis may be designed to be one of the crystal axes having a greater mobility of charge carriers. In one example, if trenches 210 are formed with (111) surfaces, the (111) surfaces will facilitate formation of crystalline epitaxial layer 220 in such a way that it achieves alignment of the high mobility crystal axis with the sidewalls of trenches 210. Such a configuration can allow from greater sensitivity of a radiation detector using a radiation-detecting structure as described herein.

In one embodiment, boron nitride may be employed in the fabrication of structure 200. For instance, boron may be used because of its neutron capture cross-section of 3840 barns (note that the barn is the standard unit for measuring a neutron cross section, which indicates the likelihood of an interaction between an incident neutron and the target material). In addition, hexagonal boron nitride (h-BN) may be grown from trenches 210 in such a way that the a-axis of the h-BN is aligned parallel to sidewalls 211, because the a-axis of h-BN is the highest charge carrier mobility axis of h-BN. Further, boron nitride is a high band-gap semiconductor, having a band gap of approximately 6 eV, facilitating operation of a radiation detector in a high temperature environment and/or with low leakage current.

In another embodiment, epitaxial layer 220 can be doped to include n-type or p-type dopants, to increase the number of available charge carriers, which can increase the radiation detection efficiency of structure 200.

In a further embodiment, a vapor phase boron precursor may be used to epitaxially grow the desired materials from sidewalls 211 of trenches 210 by repeatedly pulsing the precursor to allow time for boron atoms to move around and form the desired crystal lattice structure of epitaxial layer 220 of the radiation-responsive semiconductor material. For example, in the formation of boron nitride, precursor gases may include diborane $B_2H_6$, triethylborane $(C_2H_5)_3B$, trimethylborane $(CH_3)_3B$, ammonia $(NH_3)$, or any other suitable gas with boron and/or nitrogen.

In one or more embodiments, metalorganic vapor phase epitaxy may be used to epitaxially grow epitaxial layer 220 from sidewalls 211 of trenches 210. In one specific example, substrate 202 may be or include silicon and/or sapphire, and h-BN may be deposited at 1300° C. For example, such a process may be compatible with a silicon substrate, which has a melting point of approximately 1410° C.

In another embodiment, epitaxial layer 220 of the radiation-responsive semiconductor material may have a height of 50 μm or more, in order achieve maximum detection efficiency.

In a further embodiment, a gamma radiation-detecting structure may include an epitaxial layer of cadmium telluride or cadmium zinc telluride, which may be epitaxially grown from sidewalls 211 of trenches 210. In such a case, conformal buffer layer 203 may be or include germanium, or may be omitted, depending on the substrate used.

Figure 2E:
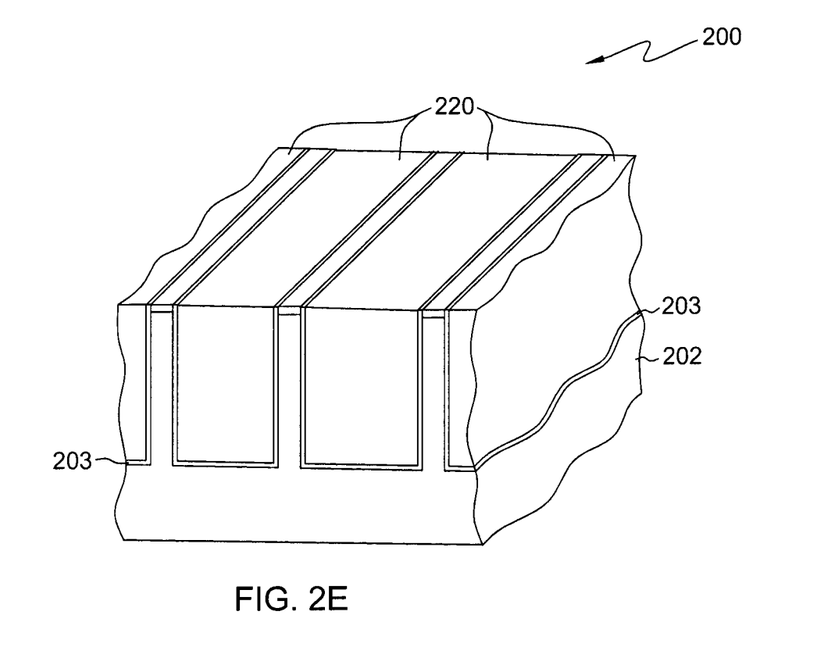
FIG. 2E depicts the structure of FIG. 2D, after completing filling the trenches with the radiation-responsive semiconductor material layer, in accordance with one or more aspects of the present invention.

FIG. 2E depicts structure 200, after filling trenches 210 with epitaxial layer 220.

In one embodiment, sidewalls 211 can confine radiation-detecting material 220 within trenches 210. Advantageously, such a configuration may inhibit buckling or separation of epitaxial layer 220 from sidewalls 211. For example, such a technique may increase the resilience of an after-formed radiation detector using structure 200, allowing for reduced cost and greater operational life span.

In another embodiment, radiation-responsive semiconductor material may have a width of 10 μm and a height approximately 10 times greater, such as 50 μm, to optimize detection efficiency.

Figure 2F:
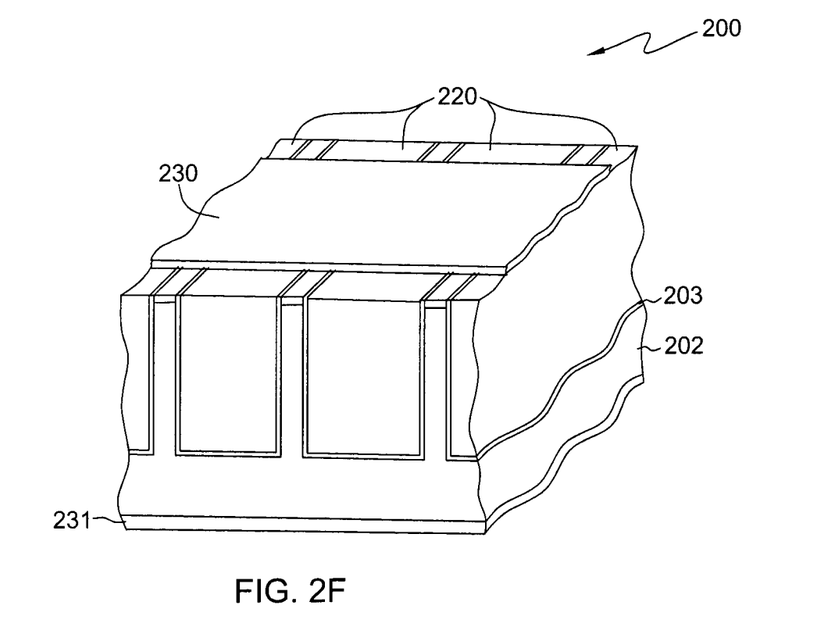
FIG. 2F depicts the structure of FIG. 2E, after providing contact structures above and below the structure and in electrical contact with the radiation-responsive semiconductor material therein, in accordance with one or more aspects of the present invention.

FIG. 2F depicts structure 220, after providing contact structures 230, 231 above and below substrate 202 and in electrical contact with the radiation-responsive semiconductor material of epitaxial layer 220, in accordance with one or more aspects of the present invention. For example, contact structures 230,231 may be used to collect charge carriers generated within the radiation-responsive semiconductor material of epitaxial layer 220 by incident radiation.

In the embodiment of FIG. 2F, contact structure 230 is disposed above epitaxial layer 220 and in physical contact therewith. In addition, contact structure 231 is disposed below radiation-responsive semiconductor material and substrate 202, allowing for electrical contact, though not necessarily physical contact of contact structure 231 and radiation responsive semiconductor material 220. In one or more embodiments, standard photolithographic patterning, selective deposition, and/or etching steps may be used to form contact structures 231, 232.

Those skilled in the art will note from the above description that there is a need for highly efficient and very robust solid-state radiation detectors, such as neutron detectors. Existing solid-state detectors make use of, for example, converter material coated micro-structures, using silicon as an active semiconductor material for charge collection. Such detectors may limited to use in low radiation (e.g., neutron) flux environments, and not suitable for high radiation flux environments due to poor radiation hardness of silicon. In addition, they may be inefficient because secondary charged particle generation and electron-hole pair generation (charge collection) occur in two different materials, inherently limiting efficiently due to the volume of radiation-responsive material that may be included. For example, semiconductors coated with radiation-responsive materials may be limited to below 10% due to a limited range of secondary particles generated when radiation reacts with the radiation responsive materials.

As noted above, alternative approaches are disclosed herein which facilitate fabrication of more robust solid-state detectors and device architectures with efficiency greater than 80%. In particular, the alternative methods and structures described herein include radiation-responsive semiconductor materials, such as two-dimensional layered semiconductor material, including hexagonal boron nitride (h-BN). Because boron, a component of h-BN, has a reasonable neutron capture cross-section of 3840 barn, both the secondary charged particle generation and charge collection due to incident radiation absorption (e.g., neutron absorption) may occur in the same medium, and a radiation detector based on h-BN could potentially reach nearly 100% efficiency. In addition, as h-BN is a wide band-gap semiconductor, a radiation detector with h-BN may be operated in harsh environments, such as high temperature, high neutron environments without significant device performance degradation.

For example, to achieve close to 100% efficiency, the thickness of h-BN should be greater than 50 μm. However, growing 50 μm of h-BN in a thin film form is quite challenging, because as the thickness of the h-BN increases greater than a certain critical thickness, the h-BN film tends to buckle. In addition, charge collection efficiency in/out of plane in a layered material tends to be very poor.

The concepts described herein include growth of h-BN in a thin film form on (111) vertical planes of, for example, silicon using, for example, metalorganic vapor phase epitaxy. For instance, a (110) silicon wafer may be the starting material, and may be patterned anisotropically to delineate (111) surfaces vertically, on which deposition of h-BN is carried out with the h-BN a-axis along the vertical (111) surface. In such a case, the h-BN a-axis has the highest electron mobility. In addition, contacts may be formed on the top and bottom of the h-BN filled trenches in order to extract the generated electron-hole pairs along the highest electron mobility path in the h-BN semiconductor. For example, detectors with aligned h-BN can have most signal counts well above the noise level, giving better gamma discrimination.

The techniques described herein have a greater efficiency than, for example, pyrolytic insulating boron nitride, which has shown efficiency reduction over time due to charge carrier trapping. For example, a radiation detector as described herein may detect a neutron by the (n, alpha) reaction, and the electron-hole pairs created by the charged particles in the h-BN semiconductor may be collected by the top and bottom contacts along the a-axis of the h-BN. In such a case, the silicon (e.g., the substrate) is not used as a semiconductor, but rather as a conductor and as a substrate for h-BN epitaxial growth. For example, such a detector is more robust because the h-BN semiconductor is less susceptible to damage from the alpha particles. In addition, such detectors can also function well in higher gamma radiation background. Further, the methods described herein are suitable to produce extremely inexpensive detector systems which may be mass produced.

Advantageously, in device architectures described herein, electron-hole pairs are collected along an axis (e.g., a-axis of h-BN) having maximum mobility and a thickness of greater than 50 μm may be achieved for maximum detector efficiency without extended growth periods because growth may occur from, for example, both (111) surfaces within a trench. In such a case, because growth time is determined by trench width, for example 10 μm (1/5$^{th}$ of, for example, a required 50 μm thickness), growth of approximately 5 μm on both sides of a silicon trench is possible. In addition, the concepts described herein may be used in neutron detectors, gamma detectors and imagers, and deep ultraviolet (UV) sensors. Further, h-BN may be grown on silicon and sapphire substrates at a temperature of 1300° C., to achieve a single crystal boron nitride film. Such a growth temperature is compatible with silicon, including growing within a trench in silicon.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of fabricating a radiation-detecting structure, the method comprising:
    providing a substrate, the substrate comprising at least one mask formed on an upper surface of the substrate and at least one trench defined by a first sidewall and a second sidewall extending into the substrate from the upper surface, the at least one trench having a width measured between the first sidewall and the second sidewall and a vertical height that is at least five times greater than the width as measured along the first sidewall and the second sidewall, the first and second sidewalls each having at least one vertical (111) surface patterned thereon;
    epitaxially growing a radiation-responsive semiconductor material layer from both the first sidewall and the second sidewall of the at least one trench of the substrate such that the radiation-responsive semiconductor material layer fills the at least one trench without extending outwards from the at least one trench past the at least one mask, the radiation-responsive semiconductor layer comprising a layer of hexagonal boron nitride, the epitaxially growing comprises growing the hexagonal boron nitride layer with an a-axis thereof aligned parallel to the at least one vertical (111) surface of the first sidewall and second sidewall of the at least one trench of the substrate, the radiation-responsive semiconductor material layer is responsive to incident radiation by generating and collecting charge carriers therein; and
    providing a first contact structure above the substrate and a second contact structure below the substrate, the first contact structure being positioned over the at least one trench and spanning at least the width of the at least one trench, the first and second contact structures being in electrical contact with the radiation-responsive semiconductor material layer and facilitating detecting the incident radiation by collecting the charge carriers generated within the radiation-responsive semiconductor material layer due to the incident radiation.

2. The method of claim 1, wherein the epitaxially growing comprises growing the radiation-responsive semiconductor material layer with a sidewall-aligned crystal axis aligned parallel to the first sidewall and the second sidewall of the at least one trench of the substrate, wherein a mobility of the charge carriers along the sidewall-aligned crystal axis of the radiation-responsive semiconductor material layer is greater than another mobility of the charge carriers along another crystal axis thereof, the greater mobility of the charge carriers along the sidewall-aligned crystal axis of the radiation-responsive semiconductor material layer facilitating detection of the incident radiation.

3. The method of claim 1, wherein the at least one vertical (111) surface of the substrate facilitates crystalline alignment of the radiation-responsive semiconductor material layer therewith.

4. The method of claim 1, wherein providing the substrate further comprises:
    providing the substrate with the upper surface thereof comprising a (110) surface; and
    anisotropically etching the substrate from the (110) surface thereof to form the at least one trench with the first sidewall and the second sidewall with the at least one vertical (111) surface, wherein the at least one vertical (111) surface of the substrate facilitates crystalline alignment of the radiation-responsive semiconductor material layer within the at least one trench.

5. The method of claim 1, wherein the first sidewall is disposed in opposing relation to the second sidewall, and the epitaxially growing further comprises filling the at least one trench with the radiation-responsive semiconductor material layer, with the first and second sidewalls of the at least one trench confining the radiation-responsive semiconductor material layer therein.

6. The method of claim 1, wherein the epitaxially growing comprises providing pulses of a precursor gas within the at least one trench, the precursor gas comprising the radiation-responsive semiconductor material, wherein the pulses of the precursor gas facilitate growth and crystallization of the radiation-responsive semiconductor material layer along the first sidewall and the second sidewall of the at least one trench.

7. The method of claim 1, wherein the epitaxially growing comprises providing a conformal buffer layer over the first sidewall and the second sidewall of the at least one trench, the conformal buffer layer inhibiting chemical reaction of the substrate and the radiation-responsive semiconductor material layer within the substrate during the epitaxially forming.

8. The method of claim 1, wherein the radiation-detecting structure comprises a neutron-detecting structure and the radiation-responsive semiconductor material layer comprises a neutron-responsive semiconductor material layer.

* * * * *